(12) United States Patent
Yura et al.

(10) Patent No.: US 12,074,295 B2
(45) Date of Patent: Aug. 27, 2024

(54) CIRCUIT BOARD ASSEMBLY

(71) Applicant: NGK INSULATORS, LTD., Nagoya (JP)

(72) Inventors: Yukinobu Yura, Nagoya (JP); Kazuki Maeda, Nagoya (JP); Shunsuke Mizukami, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 624 days.

(21) Appl. No.: 17/188,212

(22) Filed: Mar. 1, 2021

(65) Prior Publication Data
US 2021/0184269 A1 Jun. 17, 2021

Related U.S. Application Data

(63) Continuation of application No. PCT/JP2019/042329, filed on Oct. 29, 2019.

(30) Foreign Application Priority Data

Oct. 30, 2018 (JP) .................. 2018-204399

(51) Int. Cl.
*H01M 50/10* (2021.01)
*H01M 4/131* (2010.01)
(Continued)

(52) U.S. Cl.
CPC ......... *H01M 10/425* (2013.01); *H01M 4/131* (2013.01); *H01M 4/485* (2013.01);
(Continued)

(58) Field of Classification Search
CPC ............. H01M 10/425; H01M 50/521; H01M 50/522; H01M 50/213; H01M 50/514
See application file for complete search history.

(56) References Cited

U.S. PATENT DOCUMENTS

| | | | |
|---|---|---|---|
| 6,489,062 B1 | 12/2002 | Watanabe et al. | |
| 2009/0035662 A1* | 2/2009 | Scott | H01M 4/485 |
| | | | 429/231.95 |

(Continued)

FOREIGN PATENT DOCUMENTS

| | | |
|---|---|---|
| JP | 2001-142824 A | 5/2001 |
| JP | 2001-148242 A | 5/2001 |

(Continued)

OTHER PUBLICATIONS

English translation of the International Preliminary Report on Patentability (Chapter I)(Application No. PCT/JP2019/042329) dated Dec. 17, 2019.

(Continued)

*Primary Examiner* — Kenneth J Douyette
(74) *Attorney, Agent, or Firm* — BURR PATENT LAW, PLLC

(57) ABSTRACT

A circuit board assembly includes a wiring board, a coin-type secondary cell that is a lithium secondary cell electrically connected to the wiring board by reflow soldering, and a wireless communication device electrically connected to the wiring board. The coin-type secondary cell includes a positive electrode including a sintered body, a negative electrode including a sintered body, an electrolyte layer provided between the positive electrode and the negative electrode, and a cell case having an enclosed space in which the positive electrode, the negative electrode, and the electrolyte layer are housed. When C is given as the capacity of the positive electrode and A is given as the capacity of the negative electrode, $1.03<C/A<1.60$ is satisfied.

5 Claims, 5 Drawing Sheets

(51) Int. Cl.
  *H01M 4/485*      (2010.01)
  *H01M 10/04*      (2006.01)
  *H01M 10/0525*    (2010.01)
  *H01M 10/0585*    (2010.01)
  *H01M 10/42*      (2006.01)
  *H01M 50/109*     (2021.01)
  *H01M 50/50*      (2021.01)
  *H01M 50/528*     (2021.01)
  *H05K 1/18*       (2006.01)

(52) U.S. Cl.
  CPC ... *H01M 10/0436* (2013.01); *H01M 10/0525* (2013.01); *H01M 10/0585* (2013.01); *H01M 50/109* (2021.01); *H01M 50/50* (2021.01); *H01M 50/528* (2021.01); *H05K 1/181* (2013.01); *H05K 2201/10037* (2013.01)

(56) References Cited

U.S. PATENT DOCUMENTS

| | | |
|---|---|---|
| 2009/0087739 A1 | 4/2009 | Takahashi |
| 2012/0009471 A1 | 1/2012 | Sugiura et al. |
| 2012/0118741 A1* | 5/2012 | Tucholski ........... H01M 50/186 |
| | | 204/630 |
| 2016/0181671 A1 | 6/2016 | Keates et al. |
| 2018/0233731 A1 | 8/2018 | Yura et al. |
| 2018/0233744 A1 | 8/2018 | Ohira et al. |
| 2019/0252682 A1 | 8/2019 | Takeuchi et al. |
| 2019/0260070 A1 | 8/2019 | Kishimoto et al. |
| 2019/0355970 A1 | 11/2019 | Yura et al. |
| 2020/0075933 A1 | 3/2020 | Yura et al. |

FOREIGN PATENT DOCUMENTS

| | | |
|---|---|---|
| JP | 2001-250554 A | 9/2001 |
| JP | 2004-335185 A1 | 11/2004 |
| JP | 2005-310578 A1 | 11/2005 |
| JP | 4392189 B2 | 12/2009 |
| JP | 5587052 B2 | 9/2014 |
| JP | 2015-185337 A1 | 10/2015 |
| JP | 2018-504737 A1 | 2/2018 |
| JP | 6392493 B1 | 9/2018 |
| WO | 2007/086289 A1 | 8/2007 |
| WO | 2017/146088 A1 | 8/2017 |
| WO | 2017/188238 A1 | 11/2017 |
| WO | 2018/088522 A1 | 5/2018 |
| WO | 2018/092484 A1 | 5/2018 |
| WO | 2018/147387 A1 | 8/2018 |

OTHER PUBLICATIONS

Extended European Search Report, European Application No. 19 880 893.3, dated Jul. 4, 2024 (10 pages).

* cited by examiner

CIRCUIT BOARD ASSEMBLY

CROSS-REFERENCE TO RELATED APPLICATION

The present application is a continuation application of International Application No. PCT/JP2019/042329 filed on Oct. 29, 2019, which claims priority to Japanese Patent Application No. 2018-204399 filed on Oct. 30, 2018. The contents of these applications are incorporated herein by reference in their entirety.

TECHNICAL FIELD

The present invention relates to a circuit board assembly including a coin-type secondary cell.

BACKGROUND ART

A technique has conventionally been considered in which a coin-type secondary cell is mounted by reflow soldering on a wiring board. For example, Japanese Patent Publication No. 4392189 discloses a coin-type secondary cell for soldering by reflow method, in which a lithium-containing manganese oxide is used as a positive active material. In the coin-type secondary cell, the concentration of lithium salt in an electrolytic solution is set in the range of 1.5 to 2.5 mol/l so as to suppress reactions of the electrolytic solution and the lithium-containing manganese oxide induced by reflow soldering and to achieve favorable reflow heat resistance.

As a coin-type cell using a sintered body, for example, Japanese Patent Publication No. 5587052 discloses a positive electrode of a lithium secondary cell, in which a lithium composite oxide sintered plate with a thickness greater than or equal to 30 μm, a porosity of 3 to 30%, and an open porosity greater than or equal to 70% is used as a positive active material layer of the positive electrode. International Publication No. WO/2017/146088 discloses a lithium secondary cell including a solid electrolyte, in which an oriented sintered plate is used as a positive electrode. The oriented sintered plate includes a plurality of primary particles of a lithium composite oxide such as lithium cobaltate ($LiCoO_2$), and the primary particles are oriented to the plate surface of the positive electrode at an average orientation angle greater than 0° and less than or equal to 30°. Japanese Patent Application Laid-Open No. 2015-185337 discloses an all solid-state cell that uses a lithium titanate ($Li_4Ti_5O_{12}$) sintered body as an electrode.

In the case where a coin-type secondary cell is soldered by reflow method, the process of manufacturing a circuit board assembly is simplified, but cell performance deteriorates during heating. This results in deterioration in the performance of the circuit board assembly including the coin-type secondary cell.

SUMMARY OF INVENTION

The present invention is directed to a circuit board assembly.

A circuit board assembly according to the present invention includes a wiring board, a coin-type secondary cell that is a lithium secondary cell electrically connected to the wiring board by reflow soldering, and a wireless communication device electrically connected to the wiring board. The coin-type secondary cell includes a positive electrode including a sintered body, a negative electrode including a sintered body, an electrolyte layer provided between the positive electrode and the negative electrode, and a cell case having an enclosed space in which the positive electrode, the negative electrode, and the electrolyte layer are housed. When C is given as the capacity of the positive electrode and A is given as the capacity of the negative electrode, 1.03<C/A<1.60 is satisfied.

According to the present invention, it is possible to provide a circuit board assembly in which a coin-type secondary cell with high cell performance is mounted by reflow soldering.

In a preferable embodiment, the wiring board has no electronic components that are placed after the reflow soldering. In a more preferable embodiment, electrical connection between wiring on the wiring board and all electronic components that are connected to the wiring is established by reflow soldering on the wiring board.

Preferably, the coin-type secondary cell has a thickness of 0.7 to 1.6 mm and a diameter of 10 to 20 mm. In a preferable example of the coin-type secondary cell, the positive electrode includes a lithium composite oxide sintered body, and the negative electrode includes a titanium-containing sintered body.

These and other objects, features, aspects and advantages of the present invention will become more apparent from the following detailed description of the present invention when taken in conjunction with the accompanying drawings.

DESCRIPTION OF EMBODIMENTS

Coin-Type Secondary Cell

Figure 1:
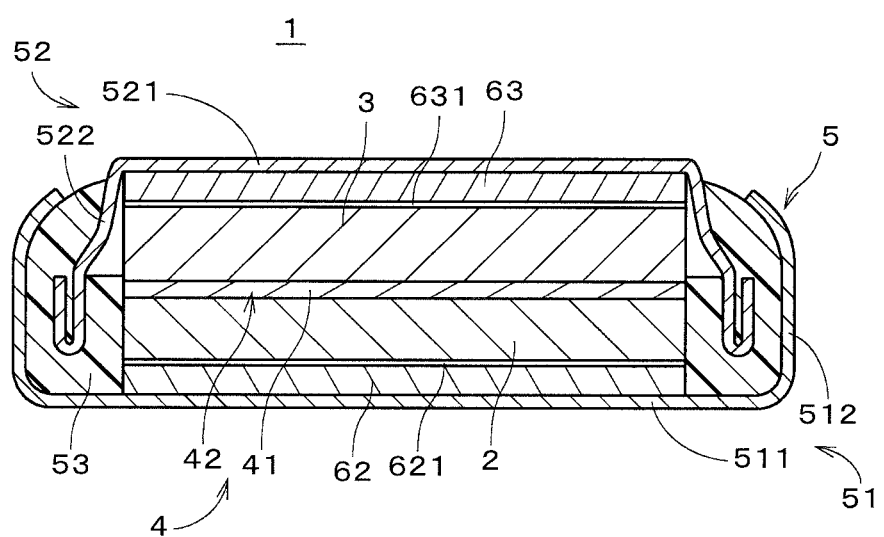
FIG. 1 is a diagram illustrating a configuration of a coin-type secondary cell.

FIG. 1 is a diagram illustrating a configuration of a coin-type secondary cell 1 according to one embodiment of the present invention. The coin-type secondary cell 1 includes a positive electrode 2, a negative electrode 3, an electrolyte layer 4, a cell case 5, a positive current collector 62, and a negative current collector 63. The electrolyte layer 4 is provided between the positive electrode 2 and the negative electrode 3. The cell case 5 has an enclosed space therein. The positive electrode 2, the negative electrode 3, the electrolyte layer 4, the positive current collector 62, and the negative current collector 63 are housed in the enclosed space. The cell case 5 includes a positive electrode can 51, a negative electrode can 52, and a gasket 53. The positive electrode can 51 has a flat plate portion 511 and a peripheral wall portion 512. The flat plate portion 511 has a disk-like shape. The peripheral wall portion 512 protrudes from the outer peripheral edge of the flat plate portion 511. The positive electrode can 51 is a container for housing the positive electrode 2. The negative electrode can 52 has a flat plate portion 521 and a peripheral wall portion 522. The flat plate portion 521 has a disk-like shape. The peripheral wall portion 522 protrudes from the outer peripheral edge of the flat plate portion 521. The negative electrode can 52 is a container for housing the negative electrode 3.

In the coin-type secondary cell 1, the flat plate portion 511 of the positive electrode can 51, the positive current collector 62, the positive electrode 2, the electrolyte layer 4, the negative electrode 3, the negative current collector 63, and the flat plate portion 521 of the negative electrode can 52 are arranged in the order specified. As will be described later, the positive current collector 62 and the negative current collector 63 may be omitted.

In the coin-type secondary cell 1, the negative electrode can 52 and the positive electrode can 51 are arranged facing each other so that the negative electrode 3 faces the positive electrode 2 with the electrolyte layer 4 therebetween. The gasket 53 has insulating properties and is provided between the peripheral wall portion 512 of the positive electrode can 51 and the peripheral wall portion 522 of the negative electrode can 52. The positive electrode can 51 and the negative electrode can 52 each have a plate thickness of, for example, 0.075 to 0.25 mm. Reducing the plate thicknesses of the positive electrode can 51 and the negative electrode can 52 in this way allows a certain degree of thickness to be ensured for the positive electrode 2 and the negative electrode 3 in the low-profile coin-type secondary cell 1, and it becomes possible to easily increase the capacity of the cell. The coin-type secondary cell 1 is designed for soldering by reflow method and is electrically connected to and mounted on a wiring board by reflow soldering.

During reflow soldering, the coin-type secondary cell 1 is heated at a high temperature (e.g., in the range of 200 to 260° C.) for a predetermined period of time, and consequently a variety of cell performance deteriorates. However, as shown in examples below, the inventors of the present invention have found out that such deterioration in cell performance caused by heating during reflow soldering can be reduced by adjusting the capacity of the positive electrode and the capacity of the negative electrode. Accordingly, it becomes possible to provide a coin-type secondary cell suitable for soldering by reflow method. By employing such a coin-type secondary cell, it also becomes possible to provide a circuit board assembly in which a coin-type secondary cell with high cell performance is mounted by soldering.

Note that the capacity of the coin-type secondary cell 1 after reflow soldering is preferably higher than or equal to 65% (typically, less than or equal to 100%) of the capacity of the cell before reflow soldering. Preferably, the capacity of the cell after reflow soldering is higher than or equal to 75% of the capacity of the cell before reflow soldering.

The positive electrode can 51 and the negative electrode can 52 are made of metal. For example, the positive electrode can 51 and the negative electrode can 52 are formed by press working (drawing) of a metal plate such as a stainless steel plate or an aluminum plate. As long as the enclosed space of the cell case 5 is ensured, different techniques may be used to form the flat plate portion 511, 521 and the peripheral wall portion 512, 522 for each of the positive electrode can 51 and the negative electrode can 52.

In the coin-type secondary cell 1 in FIG. 1, the peripheral wall portion 512 of the positive electrode can 51 is arranged outward of the peripheral wall portion 522 of the negative electrode can 52. Then, the peripheral wall portion 512 arranged on the outer side is subjected to plastic deformation, i.e., the peripheral wall portion 512 is swaged, so as to fix the positive electrode can 51 to the negative electrode can 52 via the gasket 53. This forms the aforementioned enclosed space. The area of the flat plate portion 511 of the positive electrode can 51 is larger than the area of the flat plate portion 521 of the negative electrode can 52. The circumference of a circle defined by the peripheral wall portion 512 of the positive electrode can 51 is greater than the circumference of a circle defined by the peripheral wall portion 522 of the negative electrode can 52. Since the outer peripheral surface of the peripheral wall portion 522 of the negative electrode can 52 is covered with the gasket 53, only a slight portion of the peripheral wall portion 522 of the negative electrode can 52 is in contact with the outside air.

The gasket 53 is a ring-shaped member arranged between the peripheral wall portions 512 and 522. The gasket 53 is also filled in spaces, for example between the peripheral wall portion 522 and the positive electrode 2. The gasket 53 is, for example, an insulating resin such as polypropylene, polytetrafluoroethylene, polyphenylene sulfide, perfluoroalkoxy alkane, or polychlorotrifluoroethylene. Among the above examples, polyphenylene sulfide or perfluoroalkoxy alkane with excellent heat resistance is more preferable. The gasket 53 may also be a member made of a different insulating material. In the coin-type secondary cell 1, the peripheral wall portion 522 of the negative electrode can 52 may be arranged outward of the peripheral wall portion 512 of the positive electrode can 51.

The thickness of the coin-type secondary cell 1, i.e., the distance between the outside surface of the flat plate portion 511 of the positive electrode can 51 and the outside surface of the flat plate portion 521 of the negative electrode can 52 is, for example, in the range of 0.7 to 1.6 mm. To reduce the thickness of a later-described circuit board assembly that includes the coin-type secondary cell 1 mounted thereon, an upper limit value of the thickness of the coin-type secondary cell 1 is preferably 1.4 mm, and more preferably 1.2 mm. From the viewpoint of ensuring a certain degree of thickness for the positive electrode 2 and the negative electrode 3 and increasing the capacity of the cell, a lower limit value of the thickness of the coin-type secondary cell 1 is preferably 0.8 mm, and more preferably 0.9 mm.

The coin-type secondary cell 1 has a diameter of, for example, 10 to 20 mm. The diameter of the coin-type secondary cell 1 in FIG. 1 corresponds to the diameter of the flat plate portion 511 of the positive electrode can 51. In order to achieve downsizing of the circuit board assembly that includes the coin-type secondary cell 1 mounted thereon, an upper limit value of the diameter of the coin-type secondary cell 1 is preferably 18 mm, and more preferably 16 mm. From the viewpoint of ensuring a certain degree of size for the positive electrode 2 and the negative electrode 3 and increasing the capacity of the cell, a lower limit value of the diameter of the coin-type secondary cell 1 is preferably 10.5 mm, and more preferably 11 mm.

As will be described later, a preferable coin-type secondary cell 1 uses a lithium composite oxide sintered plate as the positive electrode 2 and a titanium-containing sintered plate as the negative electrode 3. This realizes the coin-type lithium secondary cell that has excellent heat resistance to enable soldering by reflow method, that provides high capacity and high output while being low-profile and compact, and that is capable of constant-voltage (CV) charging. Before reflow soldering, the coin-type secondary cell 1 preferably has an energy density higher than or equal to 35 mWh/cm$^3$. A lower limit value of the energy density is more preferably 40 mWh/cm$^3$, and yet more preferably 50 mWh/cm$^3$. There are no particular limitations on the upper limit value of the energy density of the coin-type secondary cell 1, and the upper limit value may, for example, be 200 mWh/cm$^3$.

The positive electrode 2 is, for example, a sintered plate, i.e., a plate-like sintered body. The fact that a sintered body is used as the positive electrode 2 means that the positive electrode 2 contains neither binders nor conductive assistants. This is because even if a green sheet contains a binder, the binder will be destroyed or burnt down during firing. Using a sintered body as the positive electrode 2 allows the positive electrode 2 to ensure heat resistance during reflow soldering. Besides, deterioration of the positive electrode 2 caused by the electrolytic solution 42, which will be described later, can be moderated as a result of the positive electrode 2 including no binders. The positive electrode 2 is preferably porous, i.e., preferably has pores.

A preferable positive electrode 2 is a lithium composite oxide sintered plate. A lithium composite oxide is in particular preferably lithium cobaltate (typically, $LiCoO_2$; hereinafter abbreviated as "LCO"). Various lithium composite oxide sintered plates or LCO sintered plates are known, and for example, those that are disclosed in Japanese Patent Publication No. 5587052 and International Publication No. WO/2017/146088 may be used. Although the following description is given of the case where a lithium composite oxide sintered plate is used as the positive electrode 2, the positive electrode 2 may be an electrode of a different type depending on the design of the coin-type secondary cell 1. One example of such a different positive electrode 2 is a powder dispersed-type positive electrode (so-called coating electrode) produced by applying and drying a positive electrode mixture of, for example, a positive active material, a conductive assistant, and a binder.

The aforementioned lithium composite oxide sintered plate is preferably an oriented positive electrode plate that contains a plurality of primary particles of a lithium composite oxide and in which the primary particles are oriented at an average orientation angle greater than 0° and less than or equal to 30° relative to the plate surface of the positive electrode.

Figure 2:
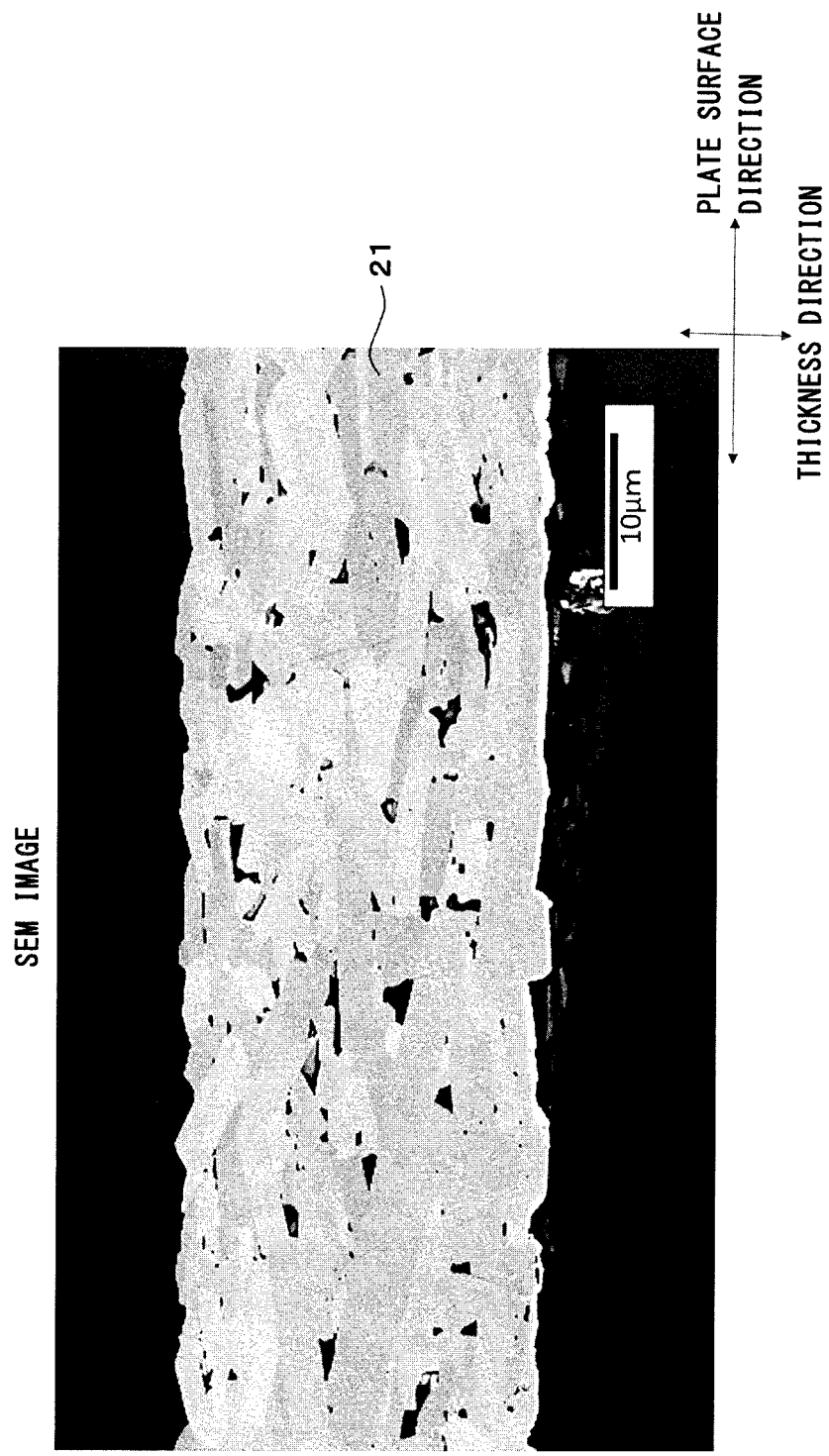
FIG. 2 is a diagram illustrating a sectional SEM image of an oriented positive electrode plate.
Figure 3:
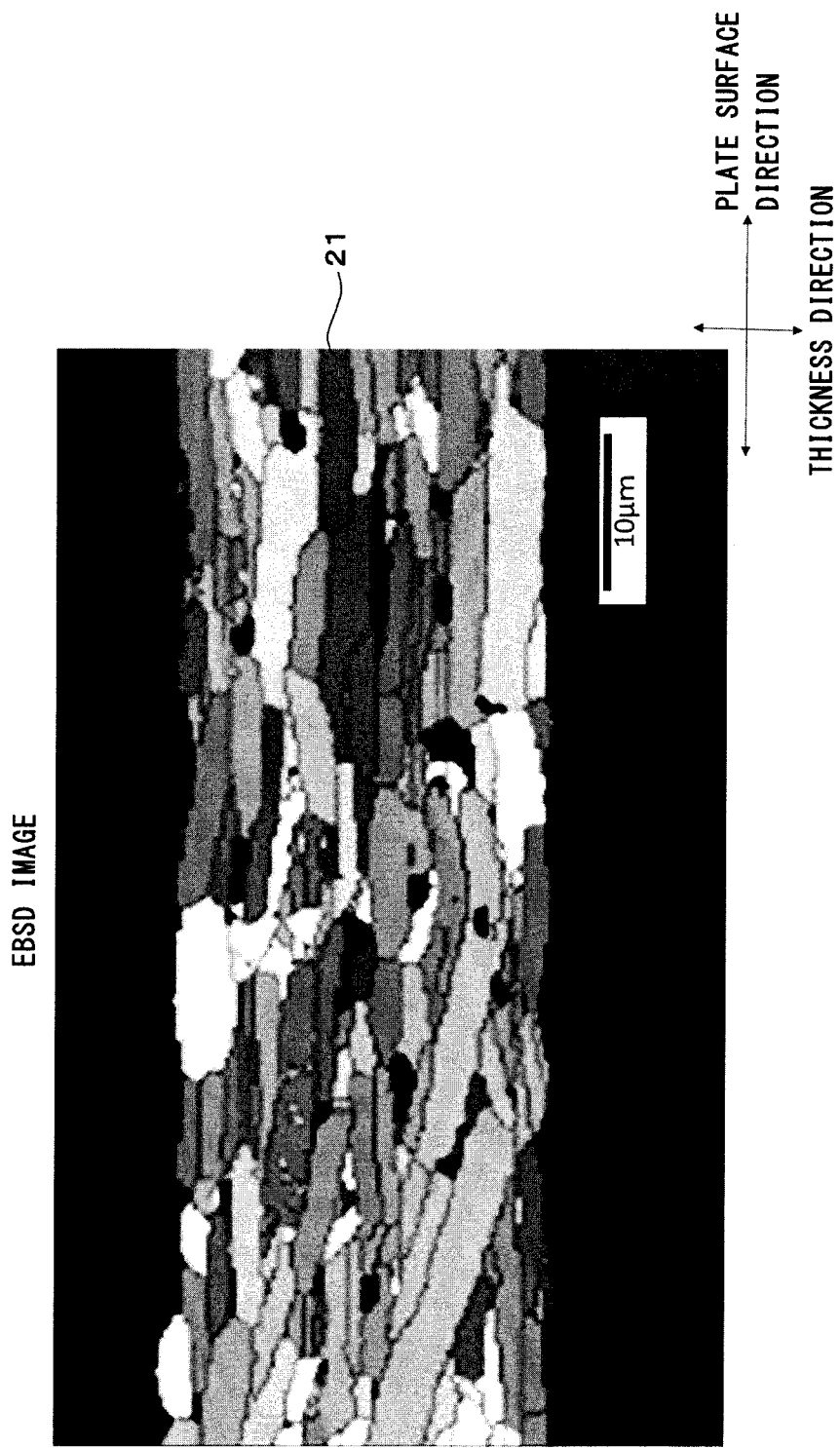
FIG. 3 is a diagram illustrating an EBSD image of a section of the oriented positive electrode plate.
Figure 4:
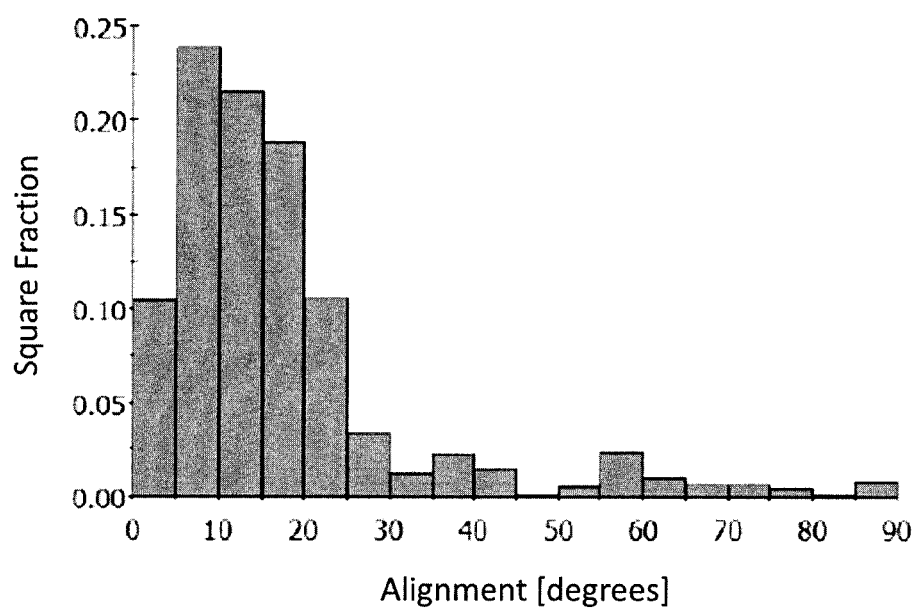
FIG. 4 is a diagram illustrating a histogram showing the angular distribution of orientation of primary particles in the EBSD image.

FIG. 2 is a diagram showing one example of a sectional SEM image perpendicular to the plate surface of the oriented positive electrode plate, and FIG. 3 is a diagram showing an electron backscatter diffraction (EBSD) image of a section perpendicular to the plate surface of the oriented positive electrode plate. FIG. 4 is a diagram illustrating a histogram showing the angular distribution of orientation of primary particles 21 in the EBSD image in FIG. 3 on an area basis. Observation of the EBSD image in FIG. 3 shows discontinuities in crystal orientation. In FIG. 3, the orientation angle of each primary particle 21 is expressed by shades of color, and the darker color indicates the smaller orientation angle. The orientation angle as used herein refers to an inclination angle formed by the (003) surface of each primary particle 21 and the plate surface direction. In FIGS. 2 and 3, portions that are displayed in black inside the oriented positive electrode plate correspond to pores.

The oriented positive electrode plate is an oriented sintered body of a plurality of primary particles 21 coupled together. Each primary particle 21 primarily has a plate-like shape, but the primary particles 21 may include those of different shapes such as a rectangular parallelepiped shape, a cubic shape, and a spherical shape. There are no particular limitations on the sectional shape of each primary particle 21, and each primary particle 21 may have a rectangular shape, a polygonal shape other than the rectangular shape, a circular shape, an oval shape, or a complex shape other than the aforementioned shapes.

Each primary particle 21 is composed of a lithium composite oxide. The lithium composite oxide is an oxide expressed as $Li_xMO_2$ ($0.05<x<1.10$, where M is at least one type of transition metal and typically contains at least one of Co, Ni, and Mn). The lithium composite oxide has a layered rock-salt structure. The layered rock-salt structure refers to a crystal structure in which a lithium layer and a layer of transition metal other than lithium are alternately stacked one above the other with a layer of oxygen therebetween, i.e., a crystal structure in which a layer of transition metal ions and a single lithium layer are alternately stacked one above the other via oxide ions (typically, an $\alpha$-$NaFeO_2$-type structure, i.e., a structure in which transition metal and lithium are regularly aligned in the axial direction of a cubic rock-salt structure). Examples of the lithium composite oxide include lithium cobaltate ($Li_xCoO_2$), lithium nickelate ($Li_xNiO_2$), lithium manganate ($Li_xMnO_2$), lithium nickel manganate ($Li_xNiMnO_2$), lithium nickel cobaltate ($Li_xNi$ $CoO_2$)), lithium cobalt nickel manganate ($Li_xCoNiMnO_2$), and lithium cobalt manganate ($Li_xCoMnO_2$). In particular, lithium cobaltate ($Li_xCoO_2$, typically $LiCoO_2$) is preferable. The lithium composite oxide may contain at least one type of elements selected from the group consisting of Mg, Al, Si, Ca, Ti, V, Cr, Fe, Cu, Zn, Ga, Ge, Sr, Y, Zr, Nb, Mo, Ag, Sn, Sb, Te, Ba, Bi, and W. These elements may be present uniformly within the positive electrode, or may be unevenly distributed on the surface. The elements, when present on the surface, may uniformly cover the surface, or may be present in island form. The elements present on the surface are expected to serve to moderate reactions with an electrolytic solution. In this case, the elements are especially preferably Zr, Mg, Ti, or Al.

As illustrated in FIGS. 3 and 4, an average value of the orientation angles of the primary particles 21, i.e., an average orientation angle, is greater than 0° and less than or equal to 30°. This brings about various advantages as follows. Firstly, each primary particle 21 lies down in a direction inclined to the thickness direction, and therefore, the adhesion between primary particles can be improved. This results in an improvement in lithium ion conductivity between a given primary particle 21 and other primary particles 21 that are adjacent to the given primary particle 21 on both sides in the longitudinal direction, and accordingly, rate performance can be improved. Secondly, the rate performance can be further improved. This is because since shrinking and swelling of the oriented positive electrode in the thickness direction, which occur during comings and goings of lithium ions, gain superiority over shrinking and swelling in the plate surface direction, the oriented positive electrode plate can shrink and swell smoothly, and following this the comings and goings of lithium ions also become smooth.

The average orientation angle of the primary particles 21 is obtained using the following technique. First, three horizontal lines and three vertical lines are drawn in an EBSD image obtained by observing a 95 μm by 125 μm rectangular region at 1000 magnifications as illustrated in FIG. 3, the three horizontal lines dividing the oriented positive electrode plate into quarters in the thickness direction, and the three vertical lines diving the oriented positive electrode plate into quarters in the plate surface direction. Next, an arithmetic mean of the orientation angles of all primary particles 21 that intersect with at least one of the three horizontal lines and the three vertical lines is calculated to obtain the average orientation angle of the primary particles 21. From the viewpoint of further improving the rate performance, the average orientation angle of the primary particles 21 is preferably less than or equal to 30°, and more preferably less than or equal to 25°. From the viewpoint of further improving the rate performance, the average orientation angle of the primary particles 21 is preferably greater than or equal to 2°, and more preferably greater than or equal to 5°.

As illustrated in FIG. 4, the orientation angles of the primary particles 21 may be widely distributed from 0° to 90°, but it is preferable that most of the orientation angles are distributed in a range greater than 0° and less than or equal to 30°. That is, when a section of the oriented sintered body forming the oriented positive electrode plate is analyzed by EBSD, a total area of primary particles 21 (hereinafter, referred to as "low-angle primary particles") whose orientation angles relative to the plate surface of the oriented positive electrode plate are greater than 0° and less than or equal to 30° among all primary particles 21 included in the section used for analysis is preferably 70% or more, and more preferably 80% or more, of the gross area of the primary particles 21 included in the section (specifically, 30 primary particles 21 used to calculate the average orientation angle). This increases the percentage of primary particles 21 with high mutual adhesion and accordingly further improves the rate performance. A total area of low-angle primary particles whose orientation angles are less than or equal to 20° is preferably 50% or more of the gross area of the 30 primary particles 21, which are used to calculate the average orientation angle. Moreover, a total area of low-angle primary particles whose orientation angles are less than or equal to 10° is more preferably 15% or more of the gross area of the 30 primary particles 21, which are used to calculate the average orientation angle.

Since each primary particle 21 mainly has a plate-like shape, a section of each primary particle 21 extends in a predetermined direction and typically forms a generally rectangular shape as illustrated in FIGS. 2 and 3. That is, when a section of the oriented sintered body is analyzed by EBSD, a total area of primary particles 21 whose aspect ratios are greater than or equal to 4 among primary particles 21 included in the section used for analysis is preferably 70% or more, and more preferably 80% or more, of the gross area of the primary particles 21 included in the section (specifically, the 30 primary particles 21 used to calculate the average orientation angle). This further improves mutual adhesion of the primary particles 21 and, as a result, further improves the rate performance. The aspect ratio of each primary particle 21 is a value obtained by dividing the maximum Feret's diameter of the primary particle 21 by the minimum Feret's diameter thereof. In the EBSD image used to observe a section, the maximum Feret's diameter is a maximum distance between two parallel straight lines when the primary particle 21 is sandwiched between these two lines. In the EBSD image, the minimum Feret's diameter is a minimum distance between two parallel straight lines when the primary particle 21 is sandwiched between these two lines.

A plurality of primary particles composing the oriented sintered body preferably have a mean particle diameter greater than or equal to 0.5 μm. Specifically, the 30 primary particles used to calculate the average orientation angle preferably have a mean particle diameter greater than or equal to 0.5 μm, more preferably greater than or equal to 0.7 μm, and yet more preferably greater than or equal to 1.0 μm. This reduces the number of grain boundaries among the primary particles 21 in the direction of conduction of lithium ions and improves lithium ion conductivity as a whole. Thus, the rate performance can be further improved. The mean particle diameter of the primary particles 21 is a value obtained as an arithmetical mean of circle equivalent diameters of the primary particles 21. The circle equivalent diameter refers to the diameter of a circle having the same area as the area of each primary particle 21 in the EBSD image.

The positive electrode 2 (e.g., a lithium composite oxide sintered plate) preferably has a porosity in the range of 20 to 60%, more preferably in the range of 25 to 55%, yet more preferably in the range of 30 to 50%, and especially preferably in the range of 30 to 45%. The presence of pores raises expectations of a stress release effect and an increase in capacity, and in the case of the oriented sintered body, further improves mutual adhesion of the primary particles 21 and accordingly further improves the rate performance. The porosity of the sintered body is calculated by polishing a section of the positive electrode plate with a cross-section (CP) polisher, observing the section at 1000 magnifications with an SEM, and binarizing a resultant SEM image. There are no particular limitations on an average circle equivalent diameter of the pores formed in the oriented sintered body, and the average circle equivalent diameter may preferably be less than or equal to 8 μm. As the average circle equivalent diameter of the pores becomes smaller, mutual adhesion of the primary particles 21 is more improved and, as a result, the rate performance is more improved. The average circle equivalent diameter of pores is a value obtained as an arithmetical mean of circle equivalent diameters of 10 pores in the EBSD image. The circle equivalent diameter as used herein refers to the diameter of a circle having the same area as the area of each pore in the EBSD image. Each pore formed in the oriented sintered body may be an open pore that is connected to the outside of the positive electrode 2, but it is preferable that each pore does not come through the positive electrode 2. Note that each pore may be a closed pore.

The positive electrode 2 (e.g., a lithium composite oxide sintered plate) preferably has a mean pore diameter of 0.1 to 10.0 μm, more preferably 0.2 to 5.0 μm, and yet more preferably 0.3 to 3.0 μm. If the mean pore diameter is within the aforementioned range, it is possible to suppress the occurrence of stress concentration in local fields of large pores and to easily release stress uniformly in the sintered body.

The positive electrode 2 preferably has a thickness of 60 to 450 μm, more preferably 70 to 350 μm, and yet more preferably 90 to 300 μm. If the thickness is within this range, it is possible to increase the active material capacity per unit area and improve the energy density of the coin-type secondary cell 1 and to suppress degradation of cell characteristics (especially, an increase in resistance value) accompanying the repetition of charging and discharging.

The negative electrode 3 is, for example, a sintered plate, i.e., a plate-like sintered body. The fact that a sintered body is used as the negative electrode 3 means that the negative electrode 3 contains neither binders nor conductive assistants. This is because even if a green sheet contains a binder, the binder will be destroyed or burnt down during firing. Using a sintered body as the negative electrode 3 allows the negative electrode 3 to ensure heat resistance during reflow soldering. Besides, the negative electrode 3 that includes no binders increases packaging density of the negative active material (e.g., LTO or $Nb_2TiO_7$, which will be described later) and provides high capacity and favorable charge and discharge efficiency. The negative electrode 3 is preferably porous, i.e., preferably has pores.

A preferable negative electrode 3 is a titanium-containing sintered plate. The titanium-containing sintered plate preferably contains lithium titanate $Li_4Ti_5O_{12}$ (hereinafter, referred to as "LTO") or niobium titanium composite oxide $Nb_2TiO_7$, and more preferably, LTO. Although LTO is typically known to have a spinel structure, a different structure may be employed during charging and discharging. For example, reactions progress while LTO contains both $Li_4Ti_5O_{12}$ (spinel structure) and $Li_7Ti_5O_{12}$ (rock-salt structure), i.e., two phases coexist, during charging and discharging. Accordingly, LTO is not limited to having a spinel structure. The LTO sintered plate may be fabricated according to, for example, the method described in Japanese Patent Application Laid-Open No. 2015-185337. Although the following description is given of the case where a titanium-containing sintered plate is used as the negative electrode 3, the negative electrode 3 may be an electrode of a different type depending on the design of the coin-type secondary cell 1. One example of such a different negative electrode 3 is a powder dispersed-type negative electrode (so-called coating electrode) produced by applying and drying a negative electrode mixture that includes, for example, a negative active material, a conductive assistant, and a binder.

The aforementioned titanium-containing sintered plate has a structure in which a plurality of (i.e., a large number of) primary particles are coupled together. Accordingly, it is preferable that these primary particles are composed of LTO or $Nb_2TiO_7$.

The negative electrode 3 preferably has a thickness of 70 to 500 μm, more preferably 85 to 400 μm, and yet more preferably 95 to 350 μm. A thicker LTO sintered plate facilitates implementation of a cell with high capacity and high energy density. The thickness of the negative electrode 3 is obtained by, for example, measuring the distance between the plate surfaces observed generally in parallel, when a section of the negative electrode 3 is observed with a scanning electron microscope (SEM).

A mean particle diameter of the primary particles composing the negative electrode 3, i.e., a primary particle diameter, is preferably less than or equal to 1.2 μm, more preferably in the range of 0.02 to 1.2 μm, and yet more preferably in the range of 0.05 to 0.7 μm. The primary particle diameter within the aforementioned range facilitates achieving both lithium ion conductivity and electron conductivity, and contributes to an improvement in rate performance.

The negative electrode 3 preferably has pores. The negative electrode 3 with pores, especially with open pores, allows penetration of the electrolytic solution into the negative electrode 3 when the negative electrode 3 is incorporated in the cell, and as a result, improves lithium ion conductivity. The reason for this is that, among two types of lithium ion conduction in the negative electrode 3, namely, conduction through constituent particles of the negative electrode 3 and conduction through the electrolytic solution in pores, the conduction through the electrolytic solution in pores is predominantly faster than the other.

The negative electrode 3 preferably has a porosity of 20 to 60%, more preferably 30 to 55%, and yet more preferably 35 to 50%. The porosity within the aforementioned range facilitates achieving both lithium ion conductivity and electron conductivity and contributes to an improvement in rate performance.

The negative electrode 3 has a mean pore diameter of, for example, 0.08 to 5.0 μm, preferably 0.1 to 3.0 μm, and more preferably 0.12 to 1.5 μm. The mean pore diameter within the aforementioned range facilitates achieving both lithium ion conductivity and electron conductivity, and contributes to an improvement in rate performance.

In the coin-type secondary cell 1 in FIG. 1, the electrolyte layer 4 includes a separator 41 and an electrolytic solution 42. The separator 41 is provided between the positive electrode 2 and the negative electrode 3. The separator 41 is porous and mainly impregnated with the electrolytic solution 42. When the positive electrode 2 and the negative electrode 3 are porous, the positive electrode 2 and the negative electrode 3 are also impregnated with the electrolytic solution 42. The electrolytic solution 42 may also exist in the interstices, for example, between the cell case 5 and each of the positive electrode 2, the negative electrode 3, and the separator 41.

The separator 41 is preferably a cellulose or ceramic separator. The cellulose separator is advantageous in terms of low cost and excellent heat resistance. The cellulose separator is also widely used. Unlike a polyolefin separator that is inferior in heat resistance, the cellulose separator not only has excellent heat resistance in itself but also has excellent wettability to γ-butyrolactone (GBL) that is a constituent part of the electrolytic solution with excellent heat resistance. Thus, in the case of using an electrolytic solution containing GBL, the separator can be impregnated enough with the electrolytic solution (without rejection). On the other hand, the ceramic separator, of course, has excellent heat resistance and also has the advantage of being able to be fabricated as an integrated sintered body as a whole together with the positive electrode 2 and the negative electrode 3. In the case of the ceramic separator, the ceramic composing the separator is preferably of at least one kind selected from the group consisting of MgO, $Al_2O_3$, $ZrO_2$, SiC, $Si_3N_4$, AlN, and cordierite, and more preferably of at least one kind selected from the group consisting of MgO, $Al_2O_3$, and $ZrO_2$.

There are no particular limitations on the electrolytic solution 42, and when the coin-type secondary cell 1 is a lithium secondary cell, a commercially available electrolytic solution for lithium cells may be used, such as a solution obtained by dissolving lithium salt in a nonaqueous solvent such as an organic solvent. In particular, an electrolytic solution with excellent heat resistance is preferable, and such an electrolytic solution preferably contains lithium borofluoride ($LiBF_4$) in the nonaqueous solvent. In this case, a preferable nonaqueous solvent is of at least one kind selected from the group consisting of γ-butyrolactone (GBL), ethylene carbonate (EC), and propylene carbonate (PC), more preferably a mixed solvent containing EC and GBL, a sole solvent containing PC, a mixed solvent containing PC and GBL, or a sole solvent containing GBL, and especially preferably a mixed solvent containing EC and GBL or a sole solvent containing GBL. The boiling point of the nonaqueous solvent can be increased by containing γ-butyrolactone (GBL), and this brings about a significant improvement in heat resistance. From this viewpoint, the volume ratio of EC and GBL in a nonaqueous solvent containing EC and/or GBL is preferably in the range of 0:1 to 1:1 (GBL ratio: 50 to 100 percent by volume), more preferably in the range of 0:1 to 1:1.5 (GBL ratio: 60 to 100 percent by volume), yet more preferably in the range of 0:1 to 1:2 (GBL ratio: 66.6 to 100 percent by volume), and especially preferably in the range of 0:1 to 1:3 (GBL ratio: 75 to 100 percent by volume). Lithium borofluoride ($LiBF_4$) dissolved in the nonaqueous solvent is an electrolyte with a high decomposition temperature and brings about also a significant improvement in heat resistance. The concentration of $LiBF_4$ in the electrolytic solution 42 is preferably in the range of 0.5 to 2 mol/l, more preferably in the range of 0.6 to 1.9 mol/l, yet more preferably in the range of 0.7 to 1.7 mol/l, and especially preferably in the range of 0.8 to 1.5 mol/l.

The electrolytic solution 42 may further contain vinylene carbonate (VC) and/or fluoroethylene carbonate (FEC) and/or vinylethylene carbonate (VEC) as (an) additive(s). Both VC and FEC have excellent heat resistance. Accordingly, as a result of the electrolytic solution 42 containing the above additive(s), an SEI film with excellent heat resistance can be formed on the surface of the negative electrode 3.

In the case where the coin-type secondary cell 1 includes the positive current collector 62 and/or the negative current collector 63, there are no particular limitations on the materials and shapes of these current collectors, but the current collectors are preferably metal foils such copper foils or aluminum foils. From the viewpoint of reducing contact resistance, a positive carbon layer 621 is preferably provided between the positive electrode 2 and the positive current collector 62. Similarly, from the viewpoint of reducing contact resistance, a negative carbon layer 631 is preferably provided between the negative electrode 3 and the negative current collector 63. The positive carbon layer 621 and the negative carbon layer 631 are both preferably composed of conductive carbon and, for example, may be formed by applying conductive carbon paste by screen printing or other techniques. As another technique, metal or carbon may be formed by sputtering on the current collecting surfaces of the electrodes. Examples of the metal species include Au, Pt, and Al.

Method of Fabricating Positive Electrode

A preferable positive electrode 2, i.e., a lithium composite oxide sintered plate, may be fabricated by any method. In one example, the positive electrode 2 is fabricated through (a) production of a lithium composite oxide-containing green sheet, (b) production of an excess lithium source-containing green sheet, the production being conducted as required, and (c) lamination and firing of the green sheet(s).

(a) Production of Lithium Composite Oxide-Containing Green Sheet

First, raw powder of a lithium composite oxide is prepared. This powder preferably contains synthesized plate-like particles (e.g., plate-like $LiCoO_2$ particles) having a composition of $LiMO_2$ (M is as described previously). The D50 particle size on a volume basis for the raw powder is preferably in the range of 0.3 to 30 μm. For example, the method of producing plate-like $LiCoO_2$ particles is performed as follows. First, $LiCoO_2$ powder is synthesized by mixing and firing $Co_3O_4$ raw powder and $Li_2CO_3$ raw powder (at a temperature of 500 to 900° C. for 1 to 20 hours). Resultant $LiCoO_2$ powder is pulverized in a pot mill into particles with D50 particle size of 0.2 μm to 10 μm on a volume basis, and accordingly plate-like $LiCoO_2$ particles are obtained, which are capable of conducting lithium ions in parallel with plate surfaces. Such $LiCoO_2$ particles may also be obtained by techniques for synthesizing plate-like crystals, such as a technique for cracking a green sheet using $LiCoO_2$ powder slurry after grain growth, a flux method, hydrothermal synthesis, single crystal breeding using a melt, and a sol-gel method. Resultant $LiCoO_2$ particles are likely to cleave along a cleavage plane. By cracking and cleaving the $LiCoO_2$ particles, plate-like $LiCoO_2$ particles are produced.

The aforementioned plate-like particles may be used singly as raw powder, or the aforementioned plate powder and another raw powder (e.g., $Co_3O_4$ particles) may be mixed together, and resultant mixed powder may be used as raw powder. In the latter case, it is preferable that the plate-like powder is caused to function as template particles that provide orientation, and the other raw powder (e.g., $Co_3O_4$ particles) is caused to function as matrix particles that are capable of growing along the template particles. In this case, powder obtained by mixing the template particles and the matrix particles in the ratio of 100:0 to 3:97 is preferably used as the raw powder. In the case of using $Co_3O_4$ raw powder as matrix particles, there are no particular limitations on the D50 particle size of the $Co_3O_4$ raw powder on a volume basis, and for example, the D50 particle size may be set in the range of 0.1 to 1.0 μm, which is preferably smaller than the D50 particle size of $LiCoO_2$ template particles on a volume basis. The matrix particles may also be obtained by performing heat treatment on a $Co(OH)_2$ raw material at a temperature of 500° C. to 800° C. for 1 to 10 hours. The matrix particles may also use $Co(OH)_2$ particles, in addition to $Co_3O_4$, or may use $LiCoO_2$ particles.

In the case where the raw powder is composed of 100% $LiCoO_2$ template particles or in the case where $LiCoO_2$ particles are used as matrix particles, a large-sized (e.g., 90 mm×90 mm in square) and flat $LiCoO_2$ sintered plate can be obtained by firing. This mechanism remains uncertain, but it can be expected that the volume is unlikely to change during firing or local variations in volume are unlikely to occur because the firing process does not include synthesis into $LiCoO_2$.

The raw powder is mixed with a dispersion medium and various additives (e.g., a binder, a plasticizer, and a dispersant) to form slurry. For the purpose of accelerating grain growth or compensating for the amount of volatilization during the firing process, which will be described later, a lithium compound other than $LiMO_2$ (e.g., lithium carbonate) may be added excessively to the slurry by an amount of approximately 0.5 to 30 mol %. It is preferable that no pore-forming materials are added to the slurry. The slurry is preferably stirred and deaerated under reduced pressure, and its viscosity is preferably adjusted to the range of 4000 to 10000 cP. Resultant slurry is molded into sheet form to obtain a lithium composite oxide-containing green sheet. The green sheet obtained in this way is an independent sheet body. The independent sheet (also referred to as a "self-supported film") as used herein refers to a sheet that is independent of other supports and can be handled separately (including a thin piece with an aspect ratio greater than or equal to 5). That is, the independent sheet does not include such a sheet that is fixedly attached to other supports (e.g., a board) and integrated with the supports (that is impossible or difficult to separate). The sheet molding is preferably performed using a molding technique that enables the application of a shearing force to plate-like particles (e.g., template particles) in the raw powder. This enables an average inclination angle of the primary particles to be kept greater than 0° and less than or equal to 30° relative to the plate surface. As the molding technique that enables the application of a shearing force to the plate-like particles, doctor blading is preferable. The thickness of the lithium composite oxide-containing green sheet may be appropriately set to the desired thickness after firing as described above.

(b) Production of Excess Lithium Source-Containing Green Sheet (Arbitrary Process)

Besides the above-described lithium composite oxide-containing green sheet, an excess lithium source-containing green sheet is produced as required. This excess lithium source is preferably a lithium compound, other than $LiMO_2$, whose components other than Li are destroyed by firing. A preferable example of such a lithium compound (excess lithium source) is lithium carbonate. The excess lithium source is preferably in powder form, and the D50 particle size of the excess lithium source powder on a volume basis is preferably in the range of 0.1 to 20 μm, and more preferably in the range of 0.3 to 10 μm. Then, the lithium source powder is mixed with a dispersion medium and various additives (e.g., a binder, a plasticizer, and a dispersant) to form slurry. It is preferable that resultant slurry is stirred and deaerated under reduced pressure, and its viscosity is adjusted to the range of 1000 to 20000 cP. Resultant slurry is molded into sheet form to obtain an excess lithium source-containing green sheet. The green sheet obtained in this way is also an independent sheet-like body. The sheet molding may be performed by any of various known methods, and doctor blading is preferable. The thickness of the excess lithium source-containing green sheet may be preferably set to a thickness that allows the molar ratio (Li/Co ratio) of the Li content in the excess lithium source-containing green sheet to the Co content in the lithium composite oxide-containing green sheet to become preferably higher than or equal to 0.1 and more preferably in the range of 0.1 to 1.1.

(c) Lamination and Firing of Green Sheet(s)

The lithium composite oxide-containing green sheet (e.g., $LiCoO_2$ green sheet) and the excess lithium source-containing green sheet (e.g., $Li_2CO_3$ green sheet) as required are placed in order on a lower setter, and an upper setter is placed thereon. The upper and lower setters are made of ceramic, and preferably made of zirconia or magnesia. When the magnesia setters are used, pores tend to be smaller. The upper setter may have a porous structure or a honeycomb structure, or may have a dense compact structure. If the upper setter is dense and compact, pores in the sintered plate tend to be smaller and the number of pores tends to increase. The excess lithium source-containing green sheet is preferably used as necessary after being cut out into a size that allows the molar ratio (Li/Co ratio) of the Li content in the excess lithium source-containing green sheet to the Co content in the lithium composite oxide-containing green sheet to become preferably higher than or equal to 0.1 and more preferably in the range of 0.1 to 1.1.

At the stage of placement of the lithium composite oxide-containing green sheet (e.g., $LiCoO_2$ green sheet) on the lower setter, this green sheet may be degreased as required and then calcined at a temperature of 600 to 850° C. for 1 to 10 hours. In this case, the excess lithium source-containing green sheet (e.g., $Li_2CO_3$ green sheet) and the upper setter may be placed in this order on a resultant calcined plate.

Then, the aforementioned green sheet(s) and/or the calcined plate, while sandwiched between the setters, are degreased as required and subjected to heat treatment (firing) at a firing temperature (e.g., 700 to 1000° C.) of a medium temperature range so as to obtain a lithium composite oxide sintered plate. This firing process may be divided into two sub-steps, or may be conducted at once. In the case where firing is performed in two steps, the first firing temperature is preferably lower than the second firing temperature. The sintered plate obtained in this way is also an independent sheet-like plate.

Method of Fabricating Negative Electrode

A preferable negative electrode 3, i.e., a titanium-containing sintered plate, may be fabricated by any method. For example, an LTO sintered plate is preferably fabricated through (a) production of an LTO-containing green sheet, and (b) firing of the LTO-containing green sheet.

(a) Production of LTO-Containing Green Sheet

First, raw powder (LTO powder) of lithium titanate $Li_4Ti_5O_{12}$ is prepared. This raw powder may be commercially available LTO powder, or may be newly synthesized powder. For example, the raw powder may be obtained by hydrolysis of a mixture of titanium tetraisopropoxy alcohol and isopropoxy lithium, or may be obtained by firing a mixture of, for example, lithium carbonate and titania. The D50 particle size of the raw powder on a volume basis is preferably in the range of 0.05 to 5.0 μm, and more preferably in the range of 0.1 to 2.0 μm. Pores tend to be large when the particle size of the raw powder is large. When the particle size of the raw material is large, pulverization processing (e.g., pot milling, bead milling, jet milling) may be performed to obtain a desired particle size. Then, the raw powder is mixed with a dispersion medium and various additives (e.g., a binder, a plasticizer, and a dispersant) to form slurry. For the purpose of accelerating grain growth or compensating for the amount of volatilization during the firing process, which will be described later, a lithium compound (e.g., lithium carbonate) other than LTO may be added excessively to the slurry by an amount of approximately 0.5 to 30 mol %. The slurry is preferably stirred and deaerated under reduced pressure, and its viscosity is preferably adjusted to the range of 4000 to 10000 cP. Resultant slurry is molded into sheet form to obtain an LTO-containing green sheet. The green sheet obtained in this way is an independent sheet-like body. The independent sheet (also referred to as a "self-supported film") as used herein refers to a sheet that is independent of other supports and can be handled separately (including a thin piece with an aspect ratio greater than or equal to 5). That is, the independent sheet does not include such a sheet that is fixedly attached to other supports (e.g., a board) and integrated with the supports (that is impossible or difficult to separate). The sheet molding may be performed by various known methods, and doctor blading is preferable. The thickness of the LTO-containing green sheet may be appropriately set to the desired thickness after firing as described above.

(b) Firing of LTO-Containing Green Sheet

The LTO-containing green sheet is placed on a setter. The setter is made of ceramic, and preferably made of zirconia or magnesia. The setter preferably has undergone embossing. The green sheet placed on the setter is inserted into a sheath. The sheath is also made of ceramic, and preferably made of alumina. Then, the green sheet in this state is degreased as required and fired so as to obtain an LTO sintered plate. This firing is preferably conducted at a temperature of 600 to 900° C. for 0.1 to 50 hours, and more preferably at a temperature of 700 to 800° C. for 0.3 to 20 hours. The sintered plate obtained in this way is also an independent sheet-like plate. The rate of temperature rise during firing is preferably in the range of 100 to 1000° C./h, and more preferably in the range of 100 to 600° C./h. In particular, this rate of temperature rise is preferably employed during the process of temperature rise at 300° C. to 800° C., and more preferably during the process of temperature rise at 400° C. to 800° C.

(c) Summary

As described above, the LTO sintered plate can be fabricated in a favorable manner. In this preferable fabrication method, 1) adjusting the particle size distribution for the LTO powder and/or 2) changing the rate of temperature rise during firing are effective, and they are considered to contribute to implementation of various characteristics of the LTO sintered plate.

Circuit Board Assembly

Figure 5:
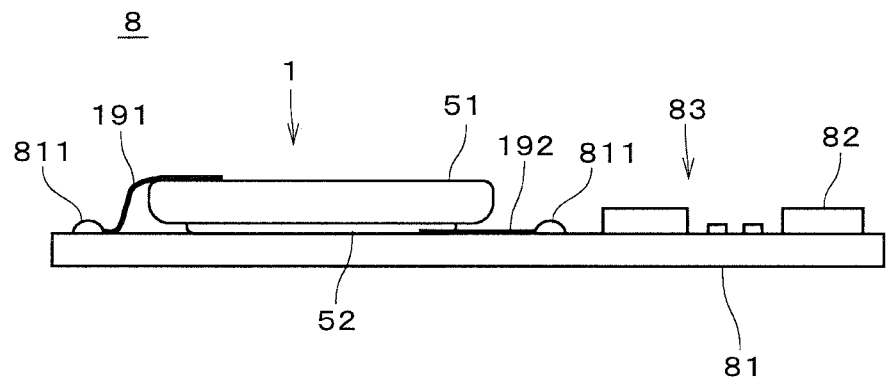
FIG. 5 is a side view of the circuit board assembly.

FIG. 5 is a side view of a circuit board assembly 8 that includes the above-described coin-type secondary cell 1. The circuit board assembly 8 further includes a wiring board 81, a wireless communication device 82, and other electronic components 83. The wiring board 81 is a so-called printed circuit board and has conductive wiring on its upper surface. The wiring may be provided inside the wiring board 81 or on the lower surface of the wiring board 81. Although only a single wiring board 81 is illustrated in FIG. 5, the wiring board 81 may have a structure obtained by assembling a plurality of partial wiring boards.

The coin-type secondary cell 1 is fixed to the wiring board 81 in such a posture that the negative electrode can 52 faces the wiring board 81. The positive electrode can 51 of the coin-type secondary cell 1 is electrically connected in advance to a lead 191, and the negative electrode can 52 is electrically connected in advance to a lead 192. End portions of the leads 191 and 192 that are most apart from the coin-type secondary cell 1 are connected with solder 811 to the wiring of the wiring board 81. The connection between the leads 191, 192 and the wiring is established by soldering by reflow method. In other words, the coin-type secondary cell 1 is electrically connected to the wiring board 81 by reflow soldering. The coin-type secondary cell 1 may be fixed to the wiring board 81 in such a posture that the positive electrode can 51 faces the wiring board 81.

The wireless communication device 82 is an electric circuit module including antennas and communication circuits. Terminals of the wireless communication device 82 are connected with solder to the wiring of the wiring board 81. The connection between the wiring and the terminals of the wireless communication device 82 is established by soldering by reflow method. In other words, the wireless communication device 82 is electrically connected to the wiring board 81 by reflow soldering. The wireless communication device 82 is a device that performs communication via radio waves. The wireless communication device 82 may be a device dedicated for transmission, or may be a device capable of both transmission and reception.

The other electronic components 83 mounted on the wiring board 81 appropriately include, for example, a circuit that generates signals to be transmitted, a circuit that processes received signals, sensors, various measuring devices, and terminals that receive input of signals from the outside.

The circuit board assembly 8 is preferably used as part of an IoT device. The term "IoT" is an abbreviation of "Internet of Things," and the "IoT device" as used herein refers to every kind of device that is connected to the Internet and exhibits specific functions.

A process is conventionally performed in which, after a socket is mounted on a wiring board by reflow soldering, a coin-type secondary cell is placed in the socket. In the circuit board assembly 8, the mounting process can be simplified because the coin-type secondary cell 1 is mounted by reflow soldering on the wiring board 81. Preferably, there are no electronic components that are placed on the wiring board 81 after the reflow soldering. This simplifies handling of the circuit board assembly 8 after the reflow soldering. Here, the language "placed after the reflow soldering" as used herein does not include connection of external wiring to the circuit board. More preferably, electrical connection between the wiring of the wiring board 81 and all electronic components connected to the wiring is established by reflow soldering on the wiring board 81. This processing can be implemented by mounting the coin-type secondary cell 1 by reflow soldering on the wiring board 81.

EXAMPLES

Next, examples will be described. Here, coin-type secondary cells of Examples 1 to 4 and Comparative Examples 1 and 2 shown in Table 1 were produced and evaluated. In the following description, $LiCoO_2$ is abbreviated as "LCO," and $Li_4Ti_5O_{19}$ is abbreviated as "LTO."

TABLE 1

| | Thickness of Positive Electrode (μm) | Thickness of Negative Electrode (μm) | C/A of Electrode | Output Performance Ratio | Pass/Failure of Drive Time |
|---|---|---|---|---|---|
| Example 1 | 183 | 240 | 1.05 | 90% | OK |
| Example 2 | 200 | 240 | 1.15 | 92% | OK |
| Example 3 | 210 | 230 | 1.25 | 93% | OK |
| Example 4 | 230 | 210 | 1.50 | 93% | OK |
| Comparative Example 1 | 175 | 240 | 1.02 | 60% | NG |
| Comparative Example 2 | 245 | 200 | 1.70 | 90% | NG |

Example 1

(1) Production of Positive Electrode

First, $Co_3O_4$ powder (produced by Seido Chemical Industry Co., Ltd.) and $Li_2CO_3$ powder (produced by Honjo Chemical Corporation) that were weighed so as to have an Li/Co molar ratio of 1.01 were mixed and then held at 780° C. for five hours, and resultant powder was pulverized and cracked in a pot mill so as to have a D50 particle size of 0.4 μm on a volume basis and to obtain powder of LCO plate-like particles. Then, 100 parts by weight of the resultant LCO powder, 100 parts by weight of a dispersion medium (toluene:isopropanol=1:1), 10 parts by weight of a binder (polyvinyl butyral: Product Number BM-2, produced by Sekisui Chemical Co., Ltd.), 4 parts by weight of a plasticizer (DOP: Di (2-ethylhexyl) phthalate, produced by Kurogane Kasei Co., Ltd.), and 2 parts by weight of a dispersant (Product Name: RHEODOL SP-O30, produced by Kao Corporation) were mixed. A resultant mixture was stirred and deaerated under reduced pressure, and its viscosity was adjusted to 4000 cP so as to prepare LCO slurry. The viscosity was measured by an LVT viscometer manufactured by AMETEK Brookfield, Inc. The slurry prepared in this way was molded into sheet form on a PET film by doctor blading so as to form an LCO green sheet. The thickness of the LCO green sheet after drying was 240 μM.

The LCO green sheet peeled off the PET film was cut out into a piece measuring 50 mm per side and placed on the center of a magnesia setter serving as a lower setter (dimensions: 90 mm per side and a height of 1 mm). On the LCO sheet, a porous magnesia setter serving as an upper setter was placed. The aforementioned LCO sheet, sandwiched between the setters, was placed in an alumina sheath measuring 120 mm per side (produced by Nikkato Corporation). At this time, the alumina sheath was not hermetically sealed, but was covered with a lid with a clearance of 0.5 mm left therebetween. Then, a resultant laminate was degreased for three hours by increasing the temperature up to 600° C. at a rate of 200° C./h, and then firing was conducted by increasing the temperature up to 800° C. at a rate of 200° C./h and holding the temperature for five hours. After the firing, the temperature was dropped to the room temperature and then a fired body was taken out of the alumina sheath. In this way, an LCO sintered plate with a thickness of approximately 200 μm was obtained. The LCO sintered plate was cut into a circular shape with a diameter of 10 mm by a laser beam machine so as to obtain a positive electrode plate.

(2) Production of Negative Electrode

First, 100 parts by weight of LTO powder (produced by Ishihara Sangyo Kaisha, Ltd.), 100 parts by weight of a dispersion medium (toluene:isopropanol=1:1), 20 parts by weight of a binder (polyvinyl butyral: Product Number BM-2, produced by Sekisui Chemical Co., Ltd.), 4 parts by weight of a plasticizer (DOP: Di (2-ethylhexyl) phthalate, produced by Kurogane Kasei Co., Ltd.), and 2 parts by weight of a dispersant (Product Name: RHEODOL SP-O30, produced by Kao Corporation) were mixed. A resultant mixture of the negative raw materials was stirred and deaerated under reduced pressure, and its viscosity was adjusted to 4000 cP so as to prepare LTO slurry. The viscosity was measured by an LUT viscometer produced by AMETEK Brookfield, Inc. The slurry prepared in this way was molded into sheet form on a PET film by doctor blading so as to form an LTO green sheet.

The resultant green sheet was cut out into a piece measuring 25 mm per side by a cutting knife and placed on a zirconia setter that had undergone embossing. The green sheet on the setter was inserted into an alumina sheath, held at 500° C. for five hours, then increased in temperature at a rate of temperature rise of 200° C./h, and fired at 765° C. for one hour. A resultant LTO sintered plate was cut into a circular shape with a diameter of 10.2 mm by a laser beam machine so as to obtain a negative electrode plate. The thickness of the negative electrode plate was approximately 230 μm.

(3) Production of Coin-Type Secondary Cell

The coin-type secondary cell 1 as schematically illustrated in FIG. 1 was produced as follows.

(3a) Adhesion of Negative Electrode Plate to Negative Current Collector with Conductive Carbon Paste Acetylene black and polyimide-amide were weighted so as to have a mass ratio of 3:1 and mixed together with an appropriate amount of NMP (N-methyl-2-pyrrolidone) serving as a solvent so as to prepare conductive carbon paste. The conductive carbon paste was screen printed on aluminum foil, which serves as a negative current collector. The negative electrode plate produced in (2) above was placed so as to fit in an undried print pattern (i.e., a region coated with conductive carbon paste), and dried under vacuum at 60° C. for 30 minutes so as to produce a negative electrode structure in which the negative electrode plate and the negative current collector were bonded together via a carbon layer. Note that the carbon layer had a thickness of 10 μm.

(3b) Preparation of Positive Current Collector with Carbon Layer

Acetylene black and polyimide-amide were weighed so as to have a mass ratio of 3:1 and mixed together with an appropriate amount of NMP (N-methyl-2-pyrrolidone) serving as a solvent so as to prepare conductive carbon paste. The conductive carbon paste was screen printed on aluminum foil serving as a positive current collector, and then dried under vacuum at 60° C. for 30 minutes so as to produce a positive current collector with a carbon layer formed on its surface. Note that the carbon layer had a thickness of 5 μm.

(3c) Assembly of Coin-Type Secondary Cell

The positive current collector, the carbon layer, the LCO positive electrode plate, the cellulose separator, the LTO negative electrode plate, the carbon layer, and the negative current collector were housed so as to be laminated one above another in this order from the positive electrode can to the negative electrode can between the positive electrode can and the negative electrode can, then filled with the electrolytic solution, and sealed by swaging the positive electrode can and the negative electrode can via a gasket. In this way, a coin cell-type lithium secondary cell (coin-type secondary cell 1) with a diameter of 12 mm and a thickness of 1.0 mm was produced. At this time, the electrolytic solution was a solution obtained by dissolving $LiBF_4$ with a concentration of 1.5 mol/l in an organic solvent, the organic solvent being obtained by mixing ethylene carbonate (EC) and γ-butyrolactone (GBL) with a volume ratio of 1:3.

(4) Measurements

(4a) Measurement of C/A of Electrode

Prior to the assembly of the coin-type secondary cell described above in (3c), an average thickness of the positive electrode and the negative electrode was measured as a reference value by a 3D-shape measuring device (VR3200, produced by Keyence Corporation). In Example 1, the positive electrode (i.e., positive electrode plate) had a thickness of 183 μm, and the negative electrode (i.e., negative electrode plate) had a thickness of 240 μm.

Next, an actual electric capacity (mAh) of the positive electrode plate per square centimeter of area at 25° C. was obtained as the capacity C of the positive electrode. This actual electric capacity was assumed to be an electric capacity for the case where constant-current constant-voltage charging at 0.2 C current and a potential of 4.25V relative to lithium metal was conducted for 10 hours, and then constant-current discharging at 0.2 C current was conducted until the potential relative to the lithium metal reached 3.0V.

On the other hand, an actual electric capacity (mAh) of the negative electrode plate per square centimeter of area at 25° C. was obtained as the capacity A of the negative electrode plate. This actual electric capacity was assumed to be an electric capacity for the case where constant-current constant-voltage charging at 0.2 C current and a potential of 0.8V relative to lithium metal was conducted for 10 hours, and then constant-current discharging at 0.2 C current was conducted until the potential relative to the lithium metal reached 2.0V. Finally, the ratio of the capacity C of the positive electrode plate to the capacity A of the negative electrode plate was calculated as C/A. In Example 1, C/A of the electrodes was 1.05.

Note that the capacities of the positive electrode and the negative electrode may be obtained by calculation using the weights of these electrodes.

(4b) Reflow Soldering Test

In assembly of the coin-type secondary cell described above in (3c), two coin-type secondary cells were assembled using electrodes equivalent to those whose C/A had been measured in (4a). One of the coin-type secondary cells was for reflow soldering test, and the other coin-type secondary cell was for reference without execution of a reflow soldering test.

The coin-type secondary cell for a reflow soldering test and a DC-DC converter serving as a step-up IC (XCL101A331ER-G, produced by TOREX Semiconductor Ltd.) were heated at 260° C. for 30 seconds in a reflow furnace (UNI-5016F, produced by ANTOM Co., Ltd.) and connected to a circuit board. On the other hand, the coin-type secondary cell for reference and the DC-DC converter were connected by manual soldering to a wiring board.

(4c) Evaluation Circuit

Figure 6:
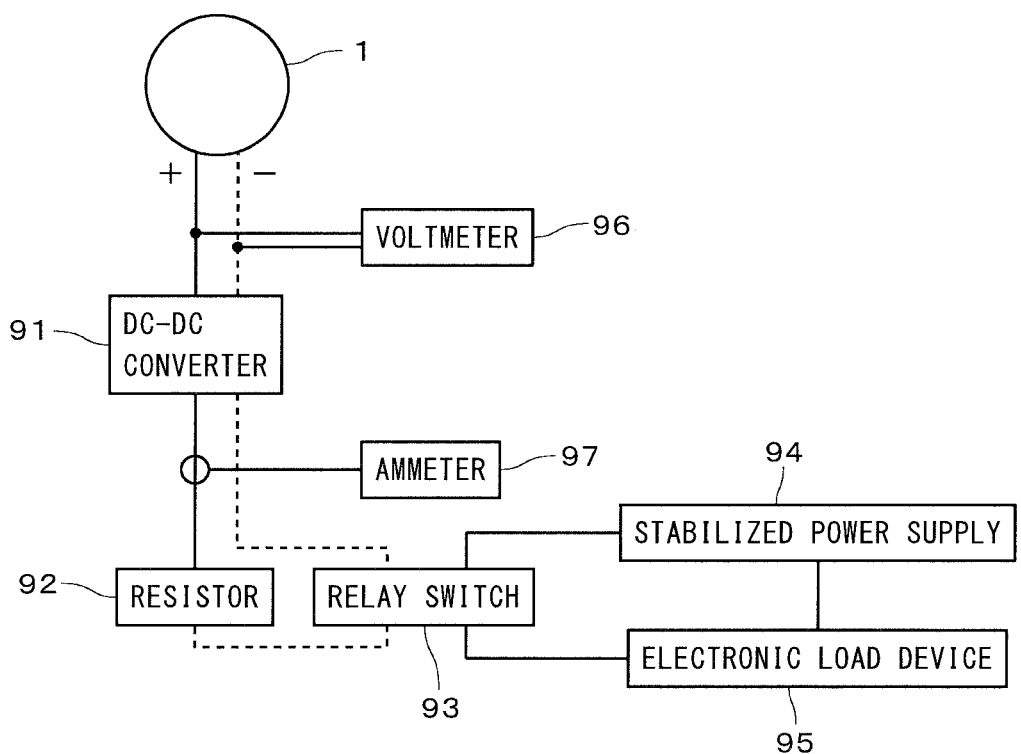
FIG. 6 is a diagram illustrating an evaluation circuit.

The circuit illustrated in FIG. 6 was configured as a circuit that evaluates a coin-type secondary cell (hereinafter, referred to as an "evaluation circuit"). In the evaluation circuit, a 3.3V constant-voltage output of a DC-DC converter 91 was connected to a resistor 92 that is set to 220Ω (AR500L25, produced by Beckman Coulter, Inc.) and a relay switch 93 (G2R-1-SN DC24, produced by OMRON Corporation). The input side of the relay switch 93 was connected to a stabilized power supply 94 (PMX500-0.1A, produced by Kikusui Electronics Corporation) and an electronic load device 95 (PLZ-30F, produced by Kikusui Electronics Corporation).

In order to monitor the output of the coin-type secondary cell 1, the input side of the DC-DC converter 91 was connected to a voltmeter 96 (MR8870, produced by Hioki E.E. Corporation), and in order to check the output current of the DC-DC converter 91, the output side of the DC-DC converter 91 was connected to an ammeter 97 (CT6700, produced by Hioki E.E. Corporation).

(4d) Measurement of Output Performance Ratio

The amount of voltage drop in the coin-type secondary cell 1 when a current of 15 mA flowed as the output from the DC-DC converter 91 for 1 s in the aforementioned evaluation circuit was measured for the coin-type secondary cell 1 that had undergone a reflow soldering test and for the coin-type secondary cell 1 for reference without execution of a reflow soldering test. A value obtained by dividing a measured value for the case where a reflow soldering test was conducted by a measured value for the case where a reflow soldering test was not conducted was adopted as an output performance ratio. Output performance ratios of 0.65 or over, i.e., 65% or over, was accepted. In Example 1, the output performance ratio was 90%. Note that accurate reasons why degradation of output performance was caused by the reflow soldering test remained uncertain, but it was assumed that increased cell resistance could be one of the reasons.

(4e) Drive Time Test

Along with the aforementioned test in (4d), 3000 cycles of a drive time test were conducted in which an operation of passing a current of 15 mA for 1 s and then taking a rest of 5 s was regarded as one cycle. A coin-type secondary cell 1 that exhibited a voltage greater than or equal to 2.0V after the 3000 cycles was assumed to have passed the drive time test. In Example 1, the coin-type secondary cell passed the test.

Examples 2 to 4

In Example 2, the positive electrode had a thickness of 200 μm, the negative electrode had a thickness of 240 μm, and C/A of the electrodes was 1.15. The output performance ratio was 92%, i.e., the coin-type secondary cell exhibited enough output performance even after the reflow soldering test and accordingly passed the drive time test.

In Example 3, the positive electrode had a thickness of 210 μm, the negative electrode had a thickness of 230 μm, and C/A of the electrodes was 1.25. The output performance ratio was 93%, i.e., the coin-type secondary cell exhibited enough output performance even after the reflow soldering test and accordingly passed the drive time test.

In Example 4, the positive electrode had a thickness of 230 μm, the negative electrode had a thickness of 210 μm, and C/A of the electrodes was 1.50. The output performance ratio was 93%, i.e., the coin-type secondary cell exhibited enough output performance even after the reflow soldering test and passed the drive time test.

Comparative Examples 1 and 2

In Comparative Example 1, the positive electrode had a thickness of 175 μm, the negative electrode had a thickness of 240 μm, and C/A of the electrodes was 1.02. The output performance ratio was 60%, i.e., the coin-type secondary cell failed to exhibit enough output performance after the reflow soldering test and accordingly failed the drive time test.

In Comparative Example 2, the positive electrode had a thickness of 245 μm, the negative electrode had a thickness of 200 μm, and C/A of the electrodes was 1.70. The output performance ratio was 90%, i.e., the coin-type secondary cell exhibited enough output performance even after the reflow soldering test, but failed the drive time test.

Evaluation

The results in Table 1 show that the influence of reflow soldering on cell performance increases in both cases where C/A of the electrodes is too large and where C/A of the electrodes is too small. The reason for this phenomenon remains uncertain, but conceivable factors are, for example, that adjusting C/A of the electrodes may lessen the influence of reactions caused by heating between the electrolytic solution and lithium in the active material, or may reduce the rate of increase in the potential of the active material caused by the influence of heating.

If the value required for the output performance ratio is determined to be higher than or equal to 65%, 60% in Comparative Example 1 is just slightly below the required output performance ratio. Also, C/A in Example 1 is 1.05, and therefore, at least 1.03 is necessary for C/A of the cell. On the other hand, it is found that C/A is preferably less than 1.60 because C/A in Example 4 is 1.50 and C/A in Comparative Example 2 is 1.70.

From the above, C/A of the cell preferably satisfies 1.03<C/A<1.60. If the coin-type secondary cell satisfies this condition, it is possible to provide a circuit board assembly in which a coin-type secondary cell with high cell performance is mounted by reflow soldering. In particular, even if the coin-type secondary cell is thin, it is possible to reduce the influence of reflow soldering on cell performance.

The above-described coin-type secondary cell 1 may be modified in various ways.

The above-described coin-type secondary cell 1 for soldering by reflow method is particularly suitable for use in IoT devices, but may of course be used in other applications.

The sintered bodies that serve as the positive electrode 2 and the negative electrode 3 may include other layers. That is, it is sufficient for the positive electrode 2 and the negative electrode 3 to include a sintered body, and they are substantially sintered bodies. The sintered bodies of the positive electrode 2 and the negative electrode 3 are not limited to the examples given in the above description. The structure of the cell case 5 is also not limited to the above-described example.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST

1 Coin-type secondary cell
2 Positive electrode
3 Negative electrode
4 Electrolyte layer
5 Cell case
8 Circuit board assembly
81 Wiring board
82 Wireless communication device

The invention claimed is:

1. A circuit board assembly comprising:
a wiring board;
a coin-type secondary cell that is a lithium secondary cell electrically connected to said wiring board by reflow soldering; and
a wireless communication device electrically connected to said wiring board,
wherein said coin-type secondary cell includes:
a positive electrode including a sintered body, said positive electrode containing neither binders nor conductive assistants;
a negative electrode including a sintered body, said negative electrode containing neither binders nor conductive assistants;
an electrolyte layer provided between said positive electrode and said negative electrode; and
a cell case having an enclosed space in which said positive electrode, said negative electrode, and said electrolyte layer are housed, and
$1.03 < C/A < 1.60$ is satisfied, where C is a capacity of said positive electrode and A is a capacity of said negative electrode.

2. The circuit board assembly according to claim 1, wherein
said wiring board has no electronic components that are placed after the reflow soldering.

3. The circuit board assembly according to claim 1, wherein
electrical connection between wiring on said wiring board and all electronic components that are connected to said wiring is established by reflow soldering on said wiring board.

4. The circuit board assembly according to claim 1, wherein
said coin-type secondary cell has a thickness of 0.7 to 1.6 mm and a diameter of 10 to 20 mm.

5. The circuit board assembly according to claim 1, wherein
said positive electrode includes a lithium composite oxide sintered body, and
said negative electrode includes a titanium-containing sintered body.

* * * * *